(12) United States Patent
Lu

(10) Patent No.: US 6,832,941 B2
(45) Date of Patent: Dec. 21, 2004

(54) SURFACE TREATMENT PROCESS FOR FABRICATING A PANEL OF AN ORGANIC LIGHT EMITTING DEVICE

(75) Inventor: Tien-Rong Lu, Tainan (TW)

(73) Assignee: Ritek Corporation (TW)

( * ) Notice: Subject to any disclaimer, the term of this patent is extended or adjusted under 35 U.S.C. 154(b) by 0 days.

(21) Appl. No.: 10/461,333

(22) Filed: Jun. 16, 2003

(65) Prior Publication Data

US 2003/0228823 A1 Dec. 11, 2003

Related U.S. Application Data

(63) Continuation of application No. 09/580,487, filed on May 30, 2000, now Pat. No. 6,630,785.

(51) Int. Cl.$^7$ ............... H01J 9/00; H01J 9/24; H01J 9/26; B05D 5/06; B05D 5/12
(52) U.S. Cl. ............ 445/24; 445/25; 313/505; 313/512; 427/66; 430/311; 430/312; 430/313
(58) Field of Search ............... 430/311–313; 313/505; 445/24

(56) References Cited

U.S. PATENT DOCUMENTS

| | | |
|---|---|---|
| 5,701,055 A | 12/1997 | Nagayama et al. |
| 5,962,970 A | 10/1999 | Yokio et al. |
| 6,013,538 A | 1/2000 | Burrows et al. |
| 6,037,712 A * | 3/2000 | Codama et al. ............. 313/498 |
| 6,140,765 A | 10/2000 | Kim et al. |
| 6,339,288 B1 * | 1/2002 | Qian et al. .................. 313/498 |
| 6,387,600 B1 * | 5/2002 | Hanson ...................... 430/316 |

* cited by examiner

Primary Examiner—Nimeshkumar D. Patel
Assistant Examiner—Matt Hodges
(74) Attorney, Agent, or Firm—Lowe Hauptman Gilman & Berner, LLP

(57) ABSTRACT

A surface treatment process for fabricating a panel of an organic light emitting device is disclosed. The surface treatment process for fabricating a panel of an organic light emitting device comprises following steps: forming on a substrate a plurality of first electrodes; forming a plurality of ramparts having T-shape cross-section on said substrate and selectively on said first electrodes through coating positive chemically amplified photoresist compositions having photo-acid generators on said substrate, exposing coated substrate to UV radiation to form latent pattern, post-exposure surface treating said photoresist on said substrate in a alkaline atmosphere and developing said photoresist; wherein each rampart protruding from said substrate and having an overhanging portion projecting in a direction parallel to said substrate; depositing organic electroluminescent media to the exposed area between said ramparts on said substrate; forming a plurality of second electrodes on said organic electroluminescent media on said substrate.

19 Claims, 2 Drawing Sheets

SURFACE TREATMENT PROCESS FOR FABRICATING A PANEL OF AN ORGANIC LIGHT EMITTING DEVICE

This application is a con of 09/580,487 filed May 30, 2000 now U.S. Pat. No. 6,630,785

FIELD OF THE INVENTION

The present invention relates to a surface treatment process for fabricating a panel of an organic light emitting device (OLED), especially associates to a surface treatment process for the isolating walls on a panel of an OLED.

BACKGROUND OF THE INVENTION

The latest OLED dominated a focus of developing flat panel display (FPD) technology in recent years. Compared with other FPDs such as LCDs (liquid crystal displays) and FEDs (Field emission displays), OLED display panels have many distinguished advantages such as light weight, high contrast, fast response speed, low power consumption and high brightness. However, there are many technical problems in the mass production and commercialization of OLED urgently needed to be solved.

For example, in the fabrication of OLED, the alignment of electrodes and prevention of short circuits between electrodes is still very important to the patterning and pixel quality of OLED. So far, the shadow mask process is widely applied in the fabrication of OLED to resolve such alignment problems of electrodes on the display panel of OLED. However, because multiple layers of different organic materials and cathode materials have to be deposited, it is difficult to use external shadow masks to accurately align each layer to form patterns on the substrate of panels, especially for the alignment of patterns with high resolution of multiple layers.

On the other hand, OLED with good display quality such as lifetime and reliability, simple processing method, low price, higher resolution, and thinner display panel (i.e. less thickness) is immediately necessary now. Nevertheless, because there are many technical problems still require to be overcome, the resolution and the thickness of OLED still cannot be effectively improved at the same time. Recently, several technologies are proposed to improve the processing of OLED, but obvious improvement on resolution and thickness of OLEDs is still very rare.

For example, Burrowa et al. disclosed a technology to form a multiple intrinsic shadow mask layer having an undercut on the substrate of display panel to accurately align the organic functional mediums and electrodes (e.g. anodes) in U.S. Pat. No. 6,013,538. The intrinsic shadow mask layer proposed by Burrowa et al. is made by multiple materials and complicated process. The cost of materials is high for this multiple shadow mask because many different materials are needed. The yield of this multiple shadow mask process is limited because complicate processing steps are required, too. In U.S. Pat. No. 5,962,970 Yokoi et al. disclosed another method to fabricate panels of organic light emitting devices. Yokoi et al. revealed in U.S. Pat. No. 5,962,970 a method to form a pattern of isolating layer having reverse-trapezoid cross-section to work as an intrinsic shadow mask and a wall to separate cathode materials from anodes for improving the display quality of the panels. However, the thickness (height) and the resolution of the isolating layer having reverse-trapezoid cross-section are limited. The thickness (or height) of isolating layer is required to be high enough (e.g. at least more than 6 $\mu$m) to avoid possible short circuits resulted from direct contact of cathode materials and anodes. As cathode formed through deposition, cathode materials will deposit on the protruding part of isolating layer. To avoid direct contact between anode and cathode materials deposited on the side walls of insulating layers (owing to lateral diffusion of cathode materials in evaporative directions), the isolating layer having reverse-trapezoid cross-section should be wide enough to act as shadow walls to separate anode materials from cathode to avoid possible shorts. If the height of isolating layer is too low, the protruding part of the isolating layer will be not wide enough to separate the side-deposited cathode materials from contacting anodes. Thus, the thickness and the width of the isolating layer having reverse-trapezoid cross section cannot be effectively reduced. Therefore the corresponding resolution and the thickness of the panel of the OLED is limited. On the other hand, since the shape of the isolating layer is reverse-trapezoid, the width of the base of the isolating layer is narrower than the width of top. The width of the base of the isolating layer having reverse-trapezoid cross section are required to be wide enough to support the isolating layer and exempt from collapsing of isolating layer. The average minimum width of the isolating layer processed by the method taught in U.S. Pat. No. 5,962,970 is around 15 $\mu$m. The average minimum height of the isolating layer processed by the method described in U.S. Pat. No. 5,962,970 is around 6 $\mu$m. The corresponding resolution and the thickness of the panel of the OLED is significantly limited.

In 1997, another method for manufacturing organic emitting devices is disclosed in U.S. Pat. No. 5,701,055. Nagayama et al. disclosed a technology to form isolating layers on panel substrate to avoid direct contact between cathode materials and anodes in U.S. Pat. No. 5,701,055. In U.S. Pat. No. 5,701,055, isolating layers having multi-layer T-shaped cross-section or reverse-trapezoid cross-section is formed on the substrate to avoid direct contact between cathode materials and anodes. Thus the isolation between anodes and cathodes of organic light emitting devices can be solved. Nevertheless, the isolating layers having T-shaped cross-section mutilayer disclosed in U.S. Pat. No. 5,701,055 are made by more than two materials. Multiple masks and lithographic processes are required for the formation of isolating layers having T-shaped cross-section in U.S. Pat. No. 5,701,055. The method for forming isolating layers having T-shaped cross-section in U.S. Pat. No. 5,701,055 solved the isolation between anodes and cathodes of OLED. However, the complicate steps of the method for forming isolating layers having T-shaped cross-section in U.S. Pat. No. 5,701,055 cost expensive because many different materials, reagents and complex processes are required. So far, the OLEDs meeting all the requirements such as relatively simple fabricating process, low cost, less material consumption, capability of mass production, high reproducible yield, high resolution and relatively low thickness are not disclosed yet and still in urgently demand now.

SUMMARY OF THE INVENTION

The object of the present invention is to provide a surface treatment process for fabricating a panel of an OLED having relatively high resolution and relatively low thickness.

Another object of the present invention is to provide a surface treatment process for preventing possible shorts of a panel of an OLED.

Another object of the present invention is to provide a surface treatment process of a panel of an OLED for facilitating the process, reducing cost and increasing the yield Another object of the present invention is to provide a surface treatment process for preventing OLEDs from shorts caused by lateral diffusion and collapse of the surface layers of OLEDs.

The surface treatment process for fabricating a panel of an OLED of the present invention comprising following steps: forming on a substrate a plurality of first electrodes; forming a plurality of ramparts having T-shape cross-section on said substrate and selectively on said first electrodes through coating positive chemically amplified photoresist compositions having photo-acid generators on said substrate, exposing coated substrate to ultraviolet (UV) radiation to form latent patterns, post-exposure surface-treating said photoresist on said substrate in an alkaline atmosphere and developing said photoresist; wherein each rampart protruding from said substrate and having an overhanging portion projecting in a direction parallel to said substrate; depositing organic electroluminescent media to the exposed areas between said ramparts on said substrate; forming a plurality of second electrodes on said organic electroluminescent media on said substrate.

The OLEDs of the present invention comprise: a substrate on which a plurality of first electrodes are formed; a plurality of ramparts having T-shape cross-section formed on said substrate and selectively on said first electrodes through coating positive chemically amplified photoresist compositions having photo-acid generators on said substrate, exposing coated substrate to UV radiation to form latent patterns, post-exposure surface-treating said photoresist on said substrate in an alkaline atmosphere and developing said photoresist; wherein each ramparts protruding from said substrate and having an overhanging portion projecting in a direction to said substrate; an organic function layers which includes at least one organic electroluminescent medium formed on the exposed areas between ramparts; and a plurality of second electrodes formed on organic functional layer.

DESCRIPTION OF THE PREFERRED EMBODIMENT

Figure 1:
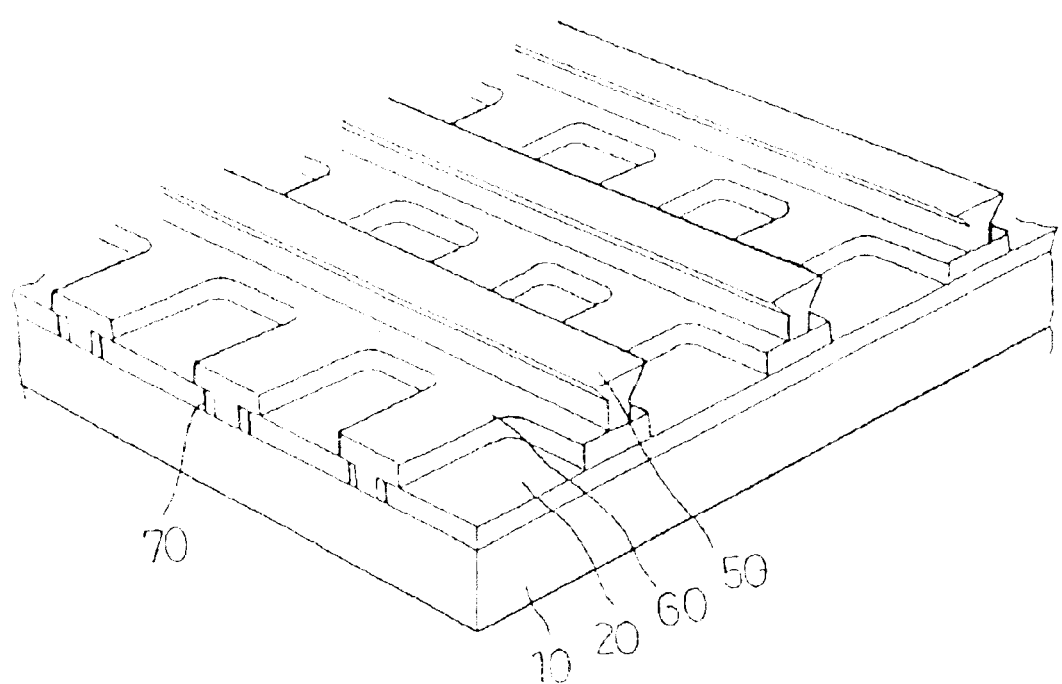
FIG. 1 is a partially enlarged perspective view of the panel of the present invention before formation of organic electroluminescent medium and second electrodes.

The surface treatment process of the present invention for fabricating a panel of an OLED having a plurality of emitting portions includes forming a plurality of first electrodes on a substrate at first. Then a plurality of ramparts having T-shape cross-section is formed on the substrate and selectively on the first electrodes. Such ramparts formed on the substrate and first electrodes are made through coating positive chemically amplified photoresist compositions having photo-acid generators on the substrate, exposing coated substrate to UV radiation to form latent patterns, post-exposure surface-treating said photoresist on said substrate in an alkaline atmosphere and developing said photoresist. The ramparts on the substrate protrudes from the substrate and having an overhanging portion projecting in a direction parallel to the substrate. Subsequently, organic electroluminescent media is formed to the exposed area between ramparts on the substrate. Furthermore, a plurality of second electrodes is formed on the organic electroluminescent media on the substrate to form a panel of an OLED.

The formation of first electrodes can be formed in patterns on substrate through conventional photolithography. There is no limit for the patterns of first electrodes. However, patterns of stripes in parallel of first electrodes are preferred. The materials of first electrodes can be any conductive materials. Preferably, the first electrodes are transparent conductive materials such as $InTiO_3$, $InSnO_3$ (ITO), $SnO_2$, $CdSnO$, $In_2O_3$ doped with ZnO or antimony. The surface treatment process of the present invention can also selectively contains step of forming a plurality of auxiliary electrodes on the substrate through photolithography before forming first electrodes on the substrate. The formation of auxiliary electrodes is to increase the conductivity of first electrodes. The auxiliary electrodes are formed by processing substrates which are deposited by conductive materials before photolithography. The materials of auxiliary electrodes can be any conductive materials. Preferably, the auxiliary electrodes are made by chromium, aluminium, copper or silver. The patterns of auxiliary electrodes made through photolithography can be any form of patterns. Preferably, the auxiliary electrodes are parallel to first electrodes formed subsequently.

A pixel-defining layer can be selectively formed after first electrodes are formed. The pixel-defining layer can be formed in patterns through photolithography. The pixel-defining layer functions as an additional protective layer to isolate anodes and cathodes. The patterns of pixel-defining layer are not limited. However, patterns of pixel-defining layer with open portions above first electrodes are preferred. The pixel-defining layer can be any electrically insulated materials. Preferably, the pixel-defining layer is polyimide.

The ramparts on the panel of the OLEDs are made of positive chemically amplified photoresist compositions that contain photo-acid generators. The positive chemically amplified photoresist compositions also contain at least a polymer in addition to photo-acid generators. Preferably, the polymers used in the chemically amplified photoresist compositions are polymers having pendant tert-butoxyl carbonyl (t-BOC) protective groups connected to the backbone of the polymers. Most preferably, polymers of the positive chemically amplified photoresist compositions are polymers with following structures:

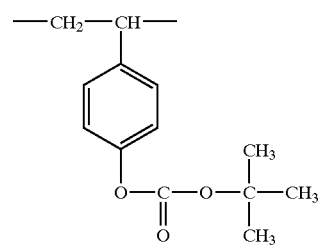

The positive chemically amplified photoresist compositions can further selectively contain other additives such as acid quenchers or solvents to improve the characteristics of the photoresist compositions or the ramparts. Any UV radiation that can initiate the photo-reaction of photoacid generators of the positive chemically amplified photoresist compositions can be adequate radiation sources for the process of the present invention. Preferably, the wavelength of adequate radiation source is about 254 nm. The positive chemically amplified photoresist compositions are used to form a plurality of ramparts having T-shape cross-section on the substrate. The ramparts having T-shape cross-section are formed by utilizing the interaction of the photo-acid generators and the UV radiation. The mechanism of forming ramparts having T-shape cross-section is accepted as following: As positive chemically amplified photoresist compositions exposed to radiation with adequate wavelength (e.g. wavelength about 254 nm), the photo-acid generators are initiated to release photo-acid anions. The released photo-acid anions are activated by following post-exposure surface-treating step. The activated photo-acid anions then react (e.g. deprotection) with the polymers in the positive chemically amplified photoresist compositions. The reaction is also catalyzed by photo-acid anions themselves to accelerate the reaction rates. As post-exposure surface treatment by alkaline atmosphere, the reaction catalyzed and initiated by photo-acid anions will be neutralized or quenched in the part near close to the surface of the area exposed to UV radiation. The region of quench or neutralization is only located on the surface of photoresist. Therefore, after post-exposure surface-treated in the alkaline atmosphere, the unexposed area of the positive chemically amplified photoresist compositions will form latent protruding ramparts having T-shape cross-section on substrates. The ramparts formed on the substrate by post-exposure surface-treating the positive chemically amplified photoresist compositions in alkaline atmosphere and developing the radiation-exposed positive chemically amplified photoresist compositions. The ramparts having T-shape cross-section is a serious drawback to be improved in the IC fabrication of semiconductor, though. Now, the ramparts having T-shape cross-section formed on the substrate of panels of OLEDs act as ideal shadow masks for subsequent deposition processes and serves as isolating walls to separate side-deposited cathode materials from anodes. The overhanging parts of the T-shape cross-section can provide enough area and length for subsequent deposition of cathode materials and further prevent direct contact of cathode materials and anodes. The side-deposition of cathode materials is owing to the lateral diffusion of cathode materials as cathode materials evaporated. Hence, the reduction of photoresist thickness in this invention is significantly beneficial to decrease the possibility of lateral diffusion during cathode evaporation and meet the reliable yield and thin tendency of OLED panels. The alkaline atmosphere can be any atmosphere of alkaline solution. Preferably, the alkaline atmosphere is the atmosphere or vapors of tetramethyl amonium hydroxide (TMAH) or potassium hydroxide that come from tetramethyl amonium hydroxide or potassium hydroxide solution. The patterns of the ramparts can be patterns having open portions above first electrodes. Patterns in parallel strides and intersecting the first electrodes are preferable.

Organic electroluminescent media are formed after a plurality of first electrodes and ramparts are formed. The organic electroluminescent media are deposited on the substrate and selectively on first electrodes. The organic electroluminescent media are deposited as a single layer or optionally multiple layers (e.g. HTL, EL, ETL) on the substrate and selectively on first electrodes.

A plurality of second electrodes is then formed on the organic electroluminescent media on the substrate. The formation of second electrodes can be formed through conventional deposition methods. The organic electroluminescent media is sandwiched by second electrodes and first electrodes on the substrate. The open portions where first electrodes and second electrodes between ramparts are the emitting portions (i.e. pixels) of OLED. The second electrodes can be any electrically conductive materials. Preferably, the second electrodes are MgAg, aluminium, diamond, diamondlike or calcium.

The substrate that applied in the process of the present invention can be transparent or not transparent. Preferably, the substrates used in the present invention are sodalime glasses, boron silica glasses, plastics or silicon wafers.

The ramparts formed through the surface treatment process of the present invention have relative stable bases (column base) than other ramparts formed through known other methods. The angles between the substrate and the column base of ramparts of the present invention are close to 90°. The nearly vertical base of ramparts support the ramparts solidly and prevent ramparts from collapsing. Compared with ramparts having reverse-trapezoid cross-section, the ramparts having T-shape cross-section are relatively strong and not apt to collapse. Even the width of the base of the ramparts is less than 1 $\mu$m (e.g. 0.18 $\mu$m), the ramparts having T-shape cross-section stand very well without collapsing. The height of the ramparts of the present invention doesn't need to be high. Even the height of the ramparts having T-shape cross-section is less than 6 $\mu$m (e.g. 4 $\mu$m), the ramparts having T-shape cross-section stand very well without collapsing. Therefore, the resolution of the OLEDs can be upgraded and the thickness the OLEDs can be reduced at the same time through the surface treatment process of the present invention. Besides, the ramparts of the present invention can reduce the deposition of second electrodes caused by lateral diffusion. The relative long overhanging part of the ramparts having T-shape cross-section provides enough wide or long area for isolating the side-deposition of second electrode material. Therefore, the possibility of short circuits resulted from direct contact of the first electrodes and the second electrode materials can be effectively reduced. On the other hand, the ramparts of the present invention are made by single material with single photolithography, the cost and complexity of photolithographic process decrease significantly.

FIG. 1 is a partially enlarged perspective view of the panel of the present invention before formation of organic electroluminescent medium and second electrodes. A plurality of auxiliary electrodes 70 is formed on the substrate 10 in parallel strides. Then a plurality of first electrodes 20 is formed in parallel stripes on the substrate 10. The first electrodes 20 are almost in the same height and each first electrode cover two auxiliary electrodes 70. A pixel-defining layer 60 in a pattern of multiple pixel windows is formed on the substrate 10 and first electrodes 20 subsequently. The open windows of the pixel-defining layer 60 locate above part of the first electrodes 20. Each stride of first electrodes 20 is separated into several open areas by the pixel-defining layer 60. A plurality of ramparts 50 which protrudes on the substrate 10 and have T-shape cross-section is formed on the pixel-defining layer 60 and the substrate 10. The ramparts 50 have an overhanging portion projecting in a direction parallel to the substrate 10. The ramparts 50 are in a pattern of parallel strides and cross over the first electrodes 20 perpendicularly. The open portions between ramparts 50 are above the open window areas of pixel-defining layer 60. The open window areas of pixel-defining layer 60 are the locations of future pixels after subsequent organic electroluminescent media 30 and second electrodes 40 form.

Figure 2:
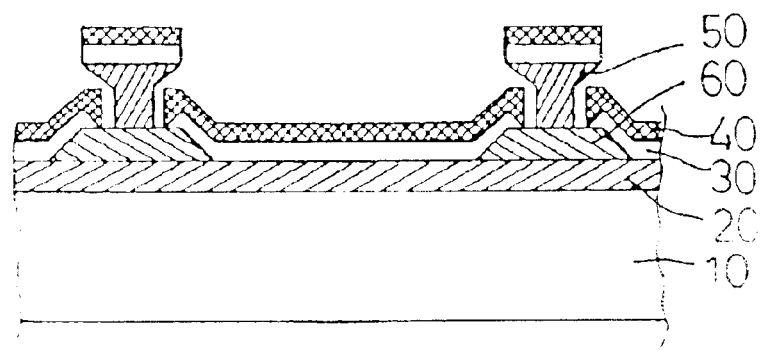
FIG. 2 is the cross-section view showing the panel achieved by the surface treatment process of the present invention.
Figure 3:
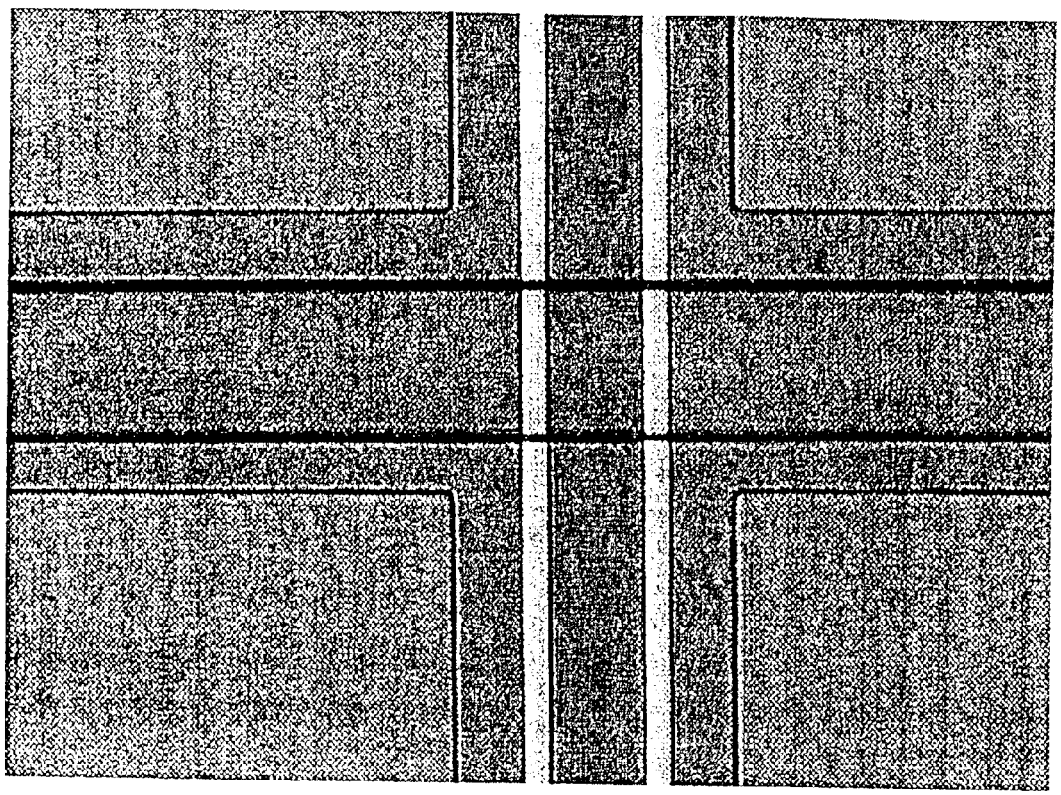
FIG. 3 is a picture of top view of partial OLED panel made by the process illuminated in example 2.

FIG. 2 is the cross-section view showing the panel achieved by the surface treatment process of the present invention. The auxiliary electrodes 70, first electrodes 20, pixel-defining layer 60 are formed as illustrated above. The organic electroluminescent media 30 is formed through deposition on the first electrodes 20 between ramparts 50. The second electrodes 40 are formed on the organic electroluminescent media 30 subsequently.

The organic light emitting device formed by the surface treatment process comprises a substrate on which a plurality of first electrodes are formed; a plurality of ramparts in T-top shape cross-section formed on said substrate and selectively on said first electrodes through coating positive chemically amplified phototesist compositions having photo-acid generators on said substrate, exposing coated substrate to UV radiation to form pattern, post-exposure surface-treating said photoresist on said substrate in a alkaline atmosphere and developing said photoresist; wherein each ramparts protruding from said substrate and having an overhanging portion projecting in a direction to said substrate; an organic function layers which includes at least one organic electroluminescent medium formed on the exposed areas between ramparts; and a plurality of second electrodes formed on organic functional layer.

The OLEDs achieved through the surface treatment process of the present invention can be applied to any display of images, graphs, symbols, letters and characters for any apparatus. Preferably, the OLEDs of the present invention are applied to the display of televisions, computers, printers, screens, vehicles, signal machines, communication devices, telephones, lights, electric books, microdisplays, fishing machines, personal digital assistants (PDA), game machines, game goggles and airplanes.

More detailed examples are used to illustrate the present invention, and these examples are used to explain the present invention. The examples below, which are given simply by way of illustration, must not be taken to limit the scope of the invention.

EXAMPLE 1

A panel of an OLED was fabricated through the surface treatment process of the present invention.

ITO anodes were formed in a pattern of stripes on a cleaned glass substrate. Then a positive chemically amplified photoresist (APEX resist from Shipley corp.) composition was spin-coated on the substrate. The coated substrate was prebaked in ovens. A mask with a pattern in strides is applied as the coated photoresist was exposed to radiation (deep UV). The exposed substrate was post-exposure baked and surfacely treated with TMAH atmosphere at the same time. Ramparts of photoresist are formed in a parallel-stride pattern. The strides of ramparts formed are also perpendicular to the strides of ITO. The ramparts formed on the substrate have T-shape cross-section. The width of ramparts strides is about 0.18 $\mu$m and the height of ramparts is about 0.8 $\mu$m. Then the exposed portions between ramparts are deposited by TPD (N,N'-diphenyl-N,N'-bis(3-methylphenyl)-1,1'-biphenyl-4,4'-diamine) at a 700 Å thickness. Subsequently, $Alq_3$ is deposited on the same area at a 500 Å thickness. MaAg was deposited on the same area at a 1000 Å thickness to form a panel of an OLED.

EXAMPLE 2

A glass substrate which was coated with a layer of chromium and ITO was used as the substrate. The auxiliary electrodes were formed through photolithography in a pattern of parallel strides. Then ITO electrodes are formed in a pattern of parallel strides as described in example 1. Then a polyimide was coated on the substrate and form a pattern through photolithography and curing at a temperature of 300° C. Then the ramparts were formed as described in example 1. The substrate with polyimide pixel-defining layer, first electrodes and auxiliary electrodes was shown in FIGS. 1 and 2. Subsequent deposition of organic electroluminescent layer and MgAg was achieved as described in example 1. Then a panel of an OLED was achieved through the surface treatment process of the present invention.

From the foregoing description, one skilled in the art can easily ascertain the essential characteristics of this invention, and, without departing from the scope thereof, can make various changes and modifications of the invention to adapt it to various usages and conditions. Thus, other embodiments are also within the claims.

What is claimed is:

1. A surface treatment process for fabricating a panel of an OLED having a plurality of emitting portions, comprising the steps of:
    a. forming on a substrate a plurality of first electrodes;
    b. forming a plurality of ramparts having T-shape cross-section on the substrate and selectively on first electrodes through coating positive chemically amplified photoresist compositions having photo-acid generators on the substrate, exposing coated substrate to UV radiation to form latent pattern, post-exposure surface-treating the photoresist on the substrate in an alkaline atmosphere and developing the photoresist; wherein the rampart protruding from the substrate and having an overhanging portion projecting in a direction parallel to the substrate;
    c. depositing organic electroluminescent media to the exposed area between the ramparts on the substrate;
    d. forming a plurality of second electrodes on the organic electroluminescent media on the substrate.

2. The process of claim 1 further comprising forming a pixel-defining layer on the substrate and selectively on the first electrodes before forming a plurality of ramparts; wherein the pixel-defining layer is made by polyimide.

3. The process of claim 1, wherein the positive chemically amplified photoresist compositions comprising polymers having pedant t-butoxy carbonyl (t-BOC) protective groups.

4. The process of claim 1, wherein the first electrodes are perpendicularly intersected with said ramparts.

5. The process of claim 1, wherein the first electrodes are transparent.

6. The process of claim 1, wherein the substrate is transparent.

7. The process of claim 1, wherein the substrate is post-exposure surface-treated in an alkaline atmosphere and developed by an alkaline solution.

8. The process of claim 1, wherein the substrate is post-exposure surface-treated in an atmosphere of tetramethyl ammonium hydroxide.

9. The process of claim 1, wherein the substrate is post-exposure surface-treated in an atmosphere of potassium hydroxide.

10. The process of claim 1, wherein the thickness of the ramparts of chemical amplified photoresist is less than 6 $\mu$m.

11. The process of claim 1, further comprising forming a plurality of auxiliary electrodes on substrate before forming a plurality of first electrodes on the substrate.

12. A surface treatment process for fabricating a panel of an OLED having a plurality of emitting portions, comprising the steps of:
    a. forming on a substrate a plurality of first electrodes;
    b. forming on the substrate and selectively on the first electrodes a plurality of ramparts having overhanging portions projecting in a direction parallel to the substrate through coating positive chemically amplified photoresist compositions having photo-acid generators on the substrate, exposing coated substrate to UV radiation to form latent pattern, post-exposure surface-treating the photoresist on the substrate in an alkaline atmosphere and developing the photoresist;

c. depositing organic electroluminescent media to the exposed area between the ramparts on the substrate;

d. forming a plurality of second electrodes on the organic electroluminescent media on the substrate.

13. The process of claim 12 further comprising forming a pixel-defining layer on the substrate and selectively on the first electrodes before forming a plurality of ramparts; wherein the pixel-defining layer is made by polyimide.

14. The process of claim 12, wherein the positive chemically amplified photoresist compositions comprising polymers having pedant t-butoxy carbonyl (t-BOC) protective groups.

15. The process of claim 12, wherein the first electrodes are perpendicularly intersected with the ramparts.

16. The process of claim 12, wherein the first electrodes are transparent.

17. The process of claim 12, wherein the substrate is transparent.

18. The process of claim 12, wherein the substrate is post-exposure surface-treated in an alkaline atmosphere and developed by an alkaline solution.

19. The process of claim 12, further comprising forming a plurality of auxiliary electrodes on the substrate before forming a plurality of first electrodes on the substrate.

* * * * *